United States Patent
Diehl et al.

(10) Patent No.: US 9,098,672 B2
(45) Date of Patent: Aug. 4, 2015

(54) METHOD FOR DETERMINING AN OPTIMAL STRUCTURE OF A HIGH-FREQUENCY SHIELD OF A HIGH-FREQUENCY ANTENNA OF A MAGNETIC RESONANCE ARRANGEMENT

(75) Inventors: Dirk Diehl, Erlangen (DE); Sebastian Martius, Forchheim (DE); Volker Matschl, Bamberg (DE); Jürgen Nistler, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 516 days.

(21) Appl. No.: 13/435,620

(22) Filed: Mar. 30, 2012

(65) Prior Publication Data
US 2013/0090896 A1    Apr. 11, 2013

(30) Foreign Application Priority Data
Mar. 31, 2011    (DE) .......... 10 2011 006 573

(51) Int. Cl.
G06F 17/50    (2006.01)
G01R 33/34    (2006.01)
G01R 33/422    (2006.01)

(52) U.S. Cl.
CPC .......... *G06F 17/5086* (2013.01); *G01R 33/422* (2013.01); *G01R 33/34007* (2013.01); *G01R 33/34076* (2013.01)

(58) Field of Classification Search
CPC .................. G01R 33/421; G01R 33/4215
See application file for complete search history.

(56) References Cited

U.S. PATENT DOCUMENTS

| | | | |
|---|---|---|---|
| 2007/0018647 A1 | 1/2007 | Freytag | |
| 2008/0231028 A1 | 9/2008 | Brandsch et al. | |
| 2008/0231276 A1 | 9/2008 | Diehl et al. | |
| 2009/0322329 A1* | 12/2009 | Diehl et al. | 324/309 |
| 2012/0229141 A1* | 9/2012 | Brown et al. | 324/322 |

FOREIGN PATENT DOCUMENTS

| | | |
|---|---|---|
| DE | 10 2005 033 989 A1 | 2/2007 |
| DE | 10 2007 014 125 A1 | 9/2008 |
| DE | 102007014135 A1 | 9/2008 |

OTHER PUBLICATIONS

Lopez et al., Evaluating passively shielded gradient coil configurations for optimal eddy current compensation, J. Phys. D: Appl. Phys. 43 (2010).*
Distributed element model, Wikipedia, Archived http://en.wikipedia.org/wiki/Distributed_element_model, Jul. 2010.*

(Continued)

*Primary Examiner* — Aniss Chad
(74) *Attorney, Agent, or Firm* — Lempia Summerfield Katz LLC

(57) ABSTRACT

A method determines an optimal structure of a high-frequency shield of a high-frequency antenna of a magnetic resonance arrangement. The high-frequency shield shields the high-frequency antenna from a gradient-coil arrangement. A three-dimensional initial structure of the high-frequency shield is defined in accordance with structural parameters and jointly with the high-frequency antenna, the gradient-coil arrangement, or both the high-frequency antenna and the gradient-coil arrangement. The structural parameters are optimized via an optimization method with respect to at least one optimization criterion.

17 Claims, 2 Drawing Sheets

(56) References Cited

OTHER PUBLICATIONS

Scattering Parameters, Wikipedia, Archived http://en.wikipedia.org/wiki/Scattering_parameters, May 2010.*

Trakic et al., Longitudinal Gradient Coil Optimization in the Presence of Transient Eddy Currents, Magnetic Resonance in Medicine 57:1119-1130 (2007).*

German Office Action dated Dec. 12, 2011 for corresponding German Patent Application No. DE 10 2011 006 573.3 with English translation.

T. Weiland, "Eine Methode zur Lösung der Maxwellschen Gleichungen für sechskomponentige Felder auf diskreter Basis," AEÜ Band 31, pp. 116-120, 1977.

* cited by examiner

METHOD FOR DETERMINING AN OPTIMAL STRUCTURE OF A HIGH-FREQUENCY SHIELD OF A HIGH-FREQUENCY ANTENNA OF A MAGNETIC RESONANCE ARRANGEMENT

This application claims the benefit of DE 10 2011 006 573.3, filed on Mar. 31, 2011.

BACKGROUND

The present embodiments relate to a method for determining an optimal structure of a high-frequency shield of a high-frequency antenna of a magnetic resonance device. The high-frequency shield shields the high-frequency antenna from a gradient-coil arrangement.

High-frequency shields are customarily employed in magnetic resonance devices for shielding the high-frequency antenna, for example a body antenna, from external influences, in particular from an adjacent gradient-coil arrangement. A number of factors may be taken into account in connection with shield structures for high-frequency antennas in magnetic resonance devices.

Good conductivity may be retained for the entire high-frequency-antenna arrangement in the interest of not affecting antenna efficiency. A second desirable factor is a high degree of high-frequency shield tightness for preventing interferences from being coupled into the high-frequency antenna and at the same time for preventing the high-frequency antenna from being coupled with high losses to components behind the shield, such as the gradient coil or PET elements. A third factor is for gradient eddy currents to be adequately suppressed to prevent the shield from overheating and to prevent imaging from being affected, since eddy currents may give rise to artifacts in certain magnetic resonance sequences.

The first two factors may be addressed simultaneously via a closed, conductive area, for example very thin copper foils, although that does not satisfy the third factor.

To address all of the factors, it has been proposed using thin copper foils having a slit structure for suppressing the eddy currents. The use of at least two layers of copper foil may simultaneously be provided, with further layers likewise having slits and being conductive for achieving adequate shield attenuation and a high level of antenna efficiency. The copper layers are separated by a thin dielectric, for example a layer 0.1 mm thick.

The slit design selection and the choice of dielectric are pertinent to addressing the above-cited factors. With currently known development methods or, as the case may be, in the production of high-frequency antennas, the slit design and dielectric are selected empirically, for example based on experience or complex and expensive trials.

DE 10 2007 014 135 A1 discloses a magnetic resonance system having a high-frequency shield that has a frequency-dependent shield effect. The high-frequency shield has a multiplicity of cells, with the cells forming a structure that is repeated two-dimensionally. Each cell is coupled via an impedance to each bordering cell, with the possibility of each impedance being embodied via discrete components. The result is a highly complex structure, which is only determined empirically, and which exhibits completely different characteristics when there are even slight deviations.

SUMMARY AND DESCRIPTION

The present embodiments may obviate one or more of the drawbacks or limitations in the related art. For example, a method for developing, checking, and/or producing high-frequency antennas is provided.

In one aspect, a three-dimensional initial structure of a high-frequency shield is defined in accordance with structural parameters and jointly with a high-frequency antenna and/or gradient-coil arrangement, after which the structural parameters are optimized via an optimization method in accordance with at least one optimization criterion.

In another aspect, an optimization method includes varying, via optimization criteria, including a target function, the structure of a high-frequency antenna to determine at least one optimal structural parameter dataset. A high-frequency antenna may thus be developed or produced without any complex trials and/or empirical knowledge. That is based on the recognition that even the slightest deviations in the structure of the high-frequency antenna may result in a significant impairment in quality. For example, a specific layer structure of the high-frequency antenna may produce excellent results in a certain angular position, while in an only slightly different position the quality may be significantly reduced. So empirical results are not always suitable for providing an improved high-frequency antenna. The disclosed methods may also be integrated in the production process of a high-frequency antenna by, for example, performing the disclosed methods before slits are provided, after which the slits are provided via suitable devices in accordance with the determined optimal structural parameters. In other words, the optimal initial structural parameters that are determined via the disclosed methods may be converted into suitable control parameters for a device for producing a high-frequency shield and used accordingly.

The disclosed methods may also provide the opportunity to test a high-frequency shield in advance or, alternatively or additionally, to optimally develop a shield in accordance with the given boundary conditions. The disclosed methods may be useful as the interleaving of high-frequency antenna, high-frequency shield, and gradient-coil arrangement becomes narrower. An optimized high-frequency shield design may also become increasingly useful with regard to multi-channel transmitting antennas as well as receiving antennas (e.g., a remote body array). While a purely experimental process may only lead by chance to a usable result, optimizing the high-frequency shield and, in association therewith, reducing the losses in the shield, may provide a multiplicity of advantages.

In one embodiment, a three-dimensional field simulation may be performed for at least one frequency based on the structure, the simulation supplying variables that specify one or more characteristics of the structure at the specific frequency and by which the optimization criterion is being evaluated. A field-simulation algorithm may be used. Such field-simulation algorithms may employ different techniques for solving Maxwell's equations in three-dimensional space. Field simulation may be implemented using the Finite Difference Time Domain (FDTD) method and/or Finite Elements method. A method based on the "Finite Integration Technique" (FIT) may be employed, which entails proceeding from a discretization of the integral form of Maxwell's equations. See also the article by T. Weiland, "A discretization method for the solution of Maxwell's equations for six-component fields", Electronics and Communication (AEU), Vol. 31, p. 116, 1977. A program packet that employs these techniques is available from, for example, the company CST AG, Darmstadt, Germany, under the name "CST STUDIO SUITE". What generally happens in such field simulations is that output parameters are determined from predefined spatial distributions of structures having certain properties. The output parameters reflect the electromagnetic properties of the described structure, in particular field distributions or interaction variables that are addressed in more detail below.

The high-frequency shield and/or high-frequency antenna and/or gradient-coil arrangement may be described as a network—described by scattering parameters—of various identical network elements, with adjacent network elements being in each case coupled by a gate. The high-frequency shield may be described as a network including mutually connected identical network elements. The usually cylindrical high-frequency shield forms in its rolled-out form an initially rectangular area. The rectangular area may then be divided into a certain number of identically sized "patches" as network elements having specific, clearly defined electromagnetic properties, such that a network element may be defined as, for example, a 1-4 cm by 1-4 cm, such as 2 cm by 2 cm, sized coated section or, in some cases, section of foil. Adjacent network elements may be coupled by a gate having one or more properties that depend on whether there are slits between the network elements or patches or whether the network elements are mutually connected. The properties may be described by scattering parameters constituting a useful choice for the structural parameters.

The high-frequency antenna and/or gradient-coil arrangement may also be described as types of networks, with the gates provided there also corresponding to the actual terminals to which a signal to the high-frequency antenna or, in some cases, gradient coil, may be applied. Generally, also for the high-frequency shield, the gates may be applied as sources having an impedance of 50 Ω.

In some embodiments a scattering-parameter matrix may be provided relating to all gates to be supplied as variables. The scattering parameters specify the network of the high-frequency shield being considered as structural parameters. Thus if, for example, a network for the high-frequency shield and the high-frequency antenna is considered, then a global scattering-parameter matrix may link the waves entering a gate to the waves exiting the gate. The scattering parameters (also abbreviated as S parameters) are suitable for performing fast optimization with respect to the losses in the overall arrangement, meaning, for instance, a high-frequency antenna plus high-frequency shield or a gradient-coil arrangement plus high-frequency shield.

If an overall arrangement including a high-frequency antenna and high-frequency shield is considered as an example, then the result of the field simulation may be a scattering-parameter matrix S. What then applies to the global system with B describing the exiting waves and A the entering waves, is $$B = S \cdot A;$$

more precisely, divided into the high-frequency excitation and shield excitation $$\begin{bmatrix} B_{HF} \\ B_{Schirm} \end{bmatrix} = \begin{bmatrix} s_{11} & s_{12} \\ s_{21} & s_{22} \end{bmatrix} \cdot \begin{bmatrix} A_{HF} \\ A_{Schirm} \end{bmatrix}. \quad (1)$$

where $s_{ij}$ are matrices whose variable depends on the number N of gates in the high-frequency shield structure and the number X of gates in the high-frequency antenna structure, meaning that matrix S has $(N+X)*(N+X)$ elements.

Now $A_{Schirm}$ and $B_{Schirm}$ are furthermore linked via a diagonal matrix $S_{Schirm}$, with the elements of diagonal matrix $S_{Schirm}$, referred to below as $s_{i,j}$, having the following meaning: If adjacent network elements are not connected (idling), then what applies is $s_{i,j}=1$, if adjacent network elements are directly connected (short circuit), then what applies is $s_{i,j}=-1$, and if adjacent network elements are connected via an impedance, for example a capacitor, then what applies is $$s_{i,j} = \frac{1 + i\omega C Z_L}{1 - i\omega C Z_L}.$$

So if the following relationship is used $$A_{Schirm} = S_{Schirm} \cdot A_{Schirm}, \quad (2)$$

formula (1) may be simplified to:

$$B_{HF} = (s_{11} + (S_{Schirm} - s_{22})^{-1} \cdot s_{21} \cdot s_{12}) \cdot A_{HF}.$$

As the target function the absorbed power $$P_{abs} = |A_{HF}|^2 - |B_{HF}|^2$$

may then be optimized, specifically minimized, by suitably selecting the structural parameters in diagonal matrix $S_{Schirm}$.

Such optimizations may also be done in the same way for the gradient excitation, with it being possible that linking occurs as addressed in more detail below. The properties obtained by means of the field simulation may be determined on a frequency-dependent basis because the scattering parameters are frequency-dependent. Since the frequency ranges of the high-frequency antenna (within the range of the magnetic resonance frequency) and of the gradient coils (within the range of a few KHz) are mutually separated, a separate consideration is one approach, which is addressed in more detail below.

Another possibility for optimization is via the electromagnetic fields or, as the case may be, electromagnetic current densities. A field distribution may be described for a uniform excitation at all gates and/or a current-density distribution to be supplied as variables, with the structural parameters describing the superimposition of a field distribution and/or current-density distribution. The field simulation therefore supplies the fields and current densities resulting from uniform excitations (A), with the minimization of surface currents or, as the case may be, their losses being an optimization criterion or, as the case may be, a target function. The optimization variables, as the structural parameters, may then be the complex coupling factors between the network elements that are correlated with the above-described scattering parameters. The coupling factors may be set within wide ranges between the network elements of the high-frequency shield via short-circuited or open connections or, as the case may be, reactive coupling elements, such as capacitors or coils. It is then possible to consider, for example, an overall current density J that may be written as $$J = \sum_i k_i J^{(i)}.$$

Complex coupling factors $k_i$ are, as already described, the structural parameters; the current densities at gates $J^{(i)}$ are obtained from the field simulation. To obtain specific values, since a field simulation is only able to supply the fields for uniform excitations, at least one typical excitation pattern in the base of the uniform excitations may be considered. Typical excitation patterns in the case of high-frequency antennas or, as the case may be, gradient-coil arrangements are therein dependent on the specific embodiment of the arrangement. For example, circular or elliptical excitations may be used, while a different weighting of different excitation patterns may be provided. Optimization via the field distributions or, as the case may be, current densities is consequently also possible in that way.

Since, for example, minimization of the overall absorbed power is employed as the optimization criterion in the case of the scattering-parameter matrix, which is conceivable for both the gradient-coil arrangement and the high-frequency antenna, minimizing the sum of the high-frequency surface losses or minimizing the high-frequency losses in a dielectric or minimizing the sum of both aforementioned losses or minimizing the shield attenuation may be expediently considered as the optimization criterion when optimizing via the field distribution and/or current-density distribution. What is to be achieved, therefore, is to minimize, for example, the surface losses for a defined excitation by the high-frequency antenna or gradient-coil arrangement.

When the task is, for example, to develop, test, or produce a high-frequency antenna that manages with slits only on at least one conducting layer, for example a copper foil, the boundary condition of the optimization method for the structural parameters to be allowed may assume as values only a value describing an existing connection between the network elements and a value describing a non-existent connection between the elements. In the aforementioned, more precisely described example of the scattering parameters, that would mean, for instance, that the scattering parameters are only allowed to assume values of 1 or −1. The structural design on which the high-frequency antenna is based may thus be established at the outset.

In another embodiment, field simulations may be conducted for a first frequency that is customary for operating the gradient-coil arrangement and for a second frequency that is customary for operating the high-frequency antenna, with there being an optimization criterion for both frequencies and the structural parameters being optimized in parallel for both optimization criteria.

As has already been mentioned, the customary excitation-frequency ranges for the high-frequency antenna and the gradient-coil arrangement lie within different ranges, namely for the high-frequency antenna usually at the corresponding Larmor frequency of the magnetic resonance device, which depends on the main field strength and is usually in the range of a few tens or hundreds of MHz. By contrast, frequencies in the range of a few KHz, for example between 1 and 10 KHz, are customary for operating the gradient-coil arrangement. For both frequency ranges or, as the case may be, certain frequencies from the relevant ranges, a field simulation may be performed that is respectively assigned to an optimization process; that means that two optimization processes having their own optimization criteria (target function) may be run in parallel. Methods that are capable of such parallel, coupled optimization are known and often supply optimization results that correlate in a curve, for example, and fulfill the target functions to different quality levels. A suitable value may then be selected from the optimization results, while boundary conditions may be set in order to further limit the number of results and/or the like. It may be useful to only consider the gradient-coil arrangement and high-frequency shield when the field simulation of the first frequency is being performed, and only consider the high-frequency antenna and high-frequency shield when the field simulation of the second frequency is being performed. Owing to the different frequencies it is also possible to separate the corresponding effects so that, for example, in the one instance only the structure of the gradient-coil arrangement and high-frequency shield are considered jointly and, in the other, only the structure of the high-frequency antenna and high-frequency shield. As described above, modeling in terms of, for example, the network elements and gates may then be limited to the partial system of relevance to the frequency.

Alternatively, the properties of the high-frequency shield may be considered in terms of eddy currents caused by fields of the gradient coils as at least one boundary condition. Hence not two optimization processes running in parallel are then provided but rather just one optimization process so that a more efficient realization may result although the sample space may be restricted.

A high-frequency shield including at least two layers may be applied. Such high-frequency shields are described in more detail in the introduction and include layers separated by a dielectric, for example two copper foils that have slits and are radially approximately 0.1 mm apart. That additionally offers degrees of freedom and may result in a high-frequency shield that is improved with respect to shield effect. At least one property of a dielectric situated between the layers may be considered as a further parameter to be optimized. The dielectric may also then be suitably modeled in the structure in order ultimately to define an additional structure parameter that is co-varied and considered in the optimization method. High-frequency shields that are further improved may also be provided thereby. For example discrete values for different suitable materials may be applied here.

As already mentioned, different boundary conditions may also be considered in the disclosed methods. Boundary conditions in the optimization method are basically known and are not explained in more detail here. Of boundary conditions in the optimization method that are considered in this specific context, one example is a defined flux density of the circular portion of the high-frequency field in the isocenter of the magnetic resonance device and/or in an excitation layer and/or in an excitation volume and/or a maximum local loss factor density and/or a maximum temperature load—derived therefrom—of the high-frequency shield. If a separate optimization method referred to the gradient-coil arrangement is not to be performed for low frequencies, then the low-frequency properties of the shield structure, for example, the permeability for gradient fields and the temperature load due to eddy-current losses, may be registered as a further boundary condition of high-frequency optimization in terms of the high-frequency antenna.

DETAILED DESCRIPTION OF THE DRAWINGS

Figure 1:
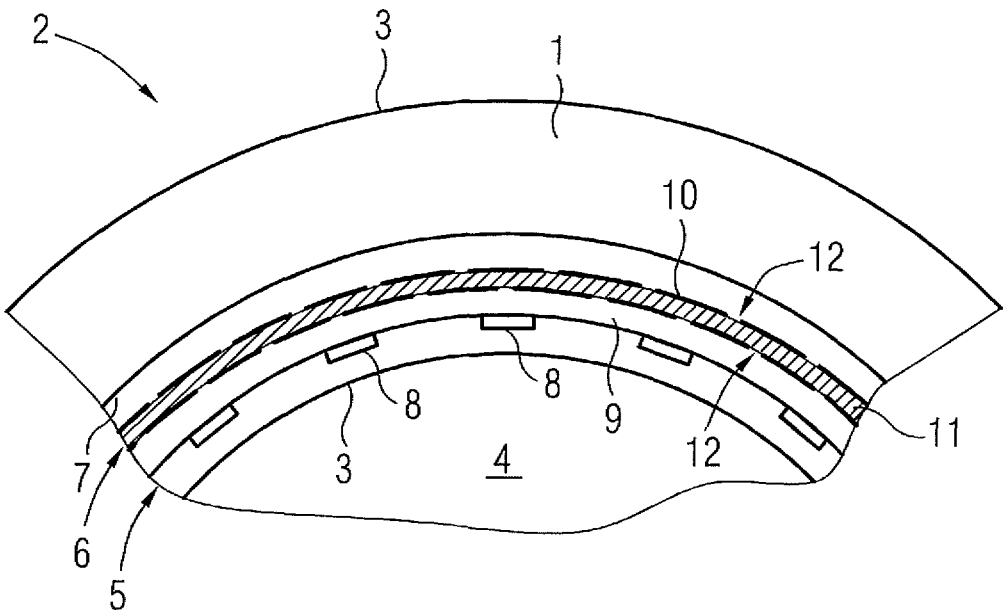
FIG. 1 shows one embodiment of a high-frequency antenna having a high-frequency shield in a magnetic resonance device.

FIG. 1 depicts a partial section through a main magnet unit 1 of a magnetic resonance device 2, which, via, its housing 3, defines a patient accommodation 4 therein. In certain radial regions, proceeding from cylindrical patient accommodation 4, various components are therein provided, including a high-frequency antenna 5 having an assigned high-frequency shield 6 to which a gradient-coil arrangement 7 is outwardly joined. High-frequency antenna 5 may include, for example, a birdcage antenna having longitudinal conductors 8 secured on a support 9.

A high-frequency shield 6 includes in this embodiment two conducting layers 10 separated by, for example, a dielectric 11, which may be 0.1-mm-thick. As shown in this example, layers 10 also have slits 12.

The disclosed methods are directed to determining an optimal structure for the high-frequency shield 6. In some embodiments, the high-frequency shield 6 may have structural parameters specifying the provision of slits 12 and also specifying coupling elements (for example capacitors or coils).

Figure 2:
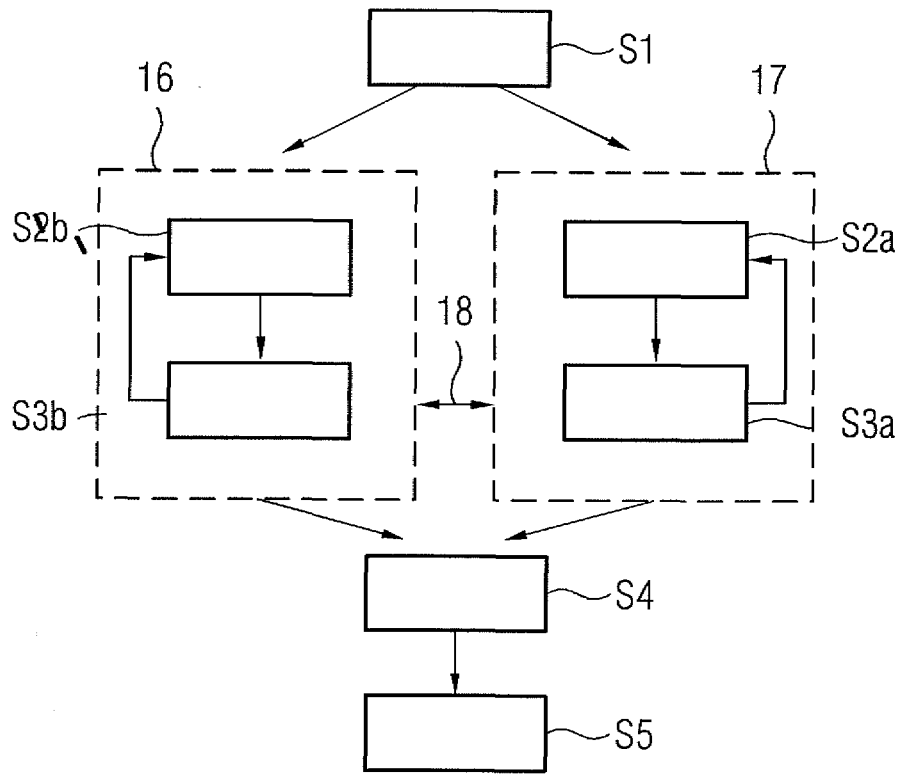
FIG. 2 is a flowchart of one embodiment of the disclosed methods.
Figure 3:
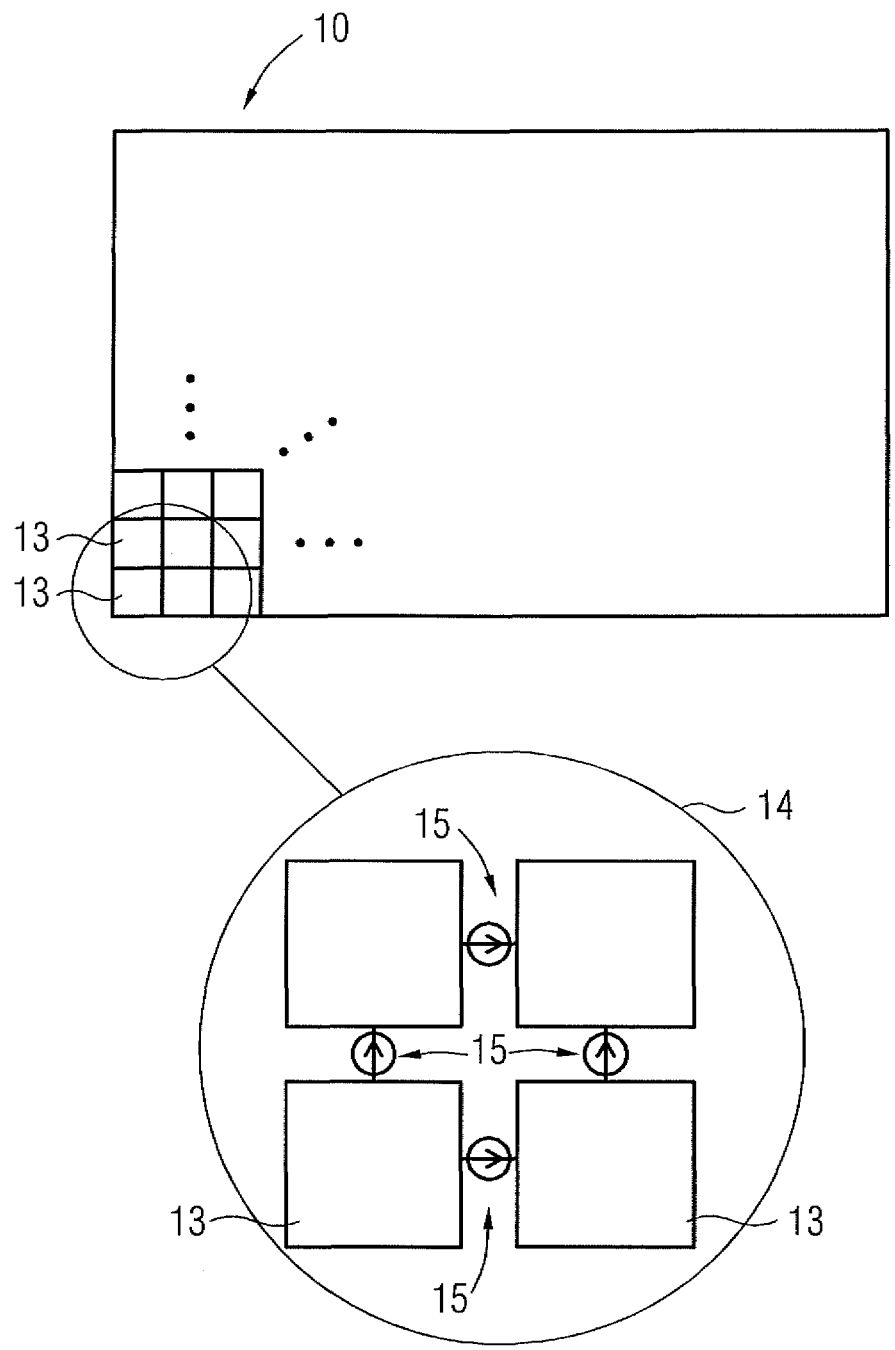
FIG. 3 depicts one example of a high-frequency shield specified through a network.

FIG. 2 is a flowchart of an exemplary embodiment of the disclosed methods. In act S1, an initial structure is defined that is specified by the structural parameters and by other inputs and proceeding from which optimization is to occur. In this example, the initial structure includes not only the structure of the high-frequency shield 6 but also the structure of the gradient-coil arrangement 7 and the high-frequency antenna 5. All three components in this example are shown as a network. The three components have various network elements that are defined by their position in space and their electromagnetic properties, and are connected by gates. FIG. 3 shows how the structure of the high-frequency shield 6 for a layer 10 is imaged as a network. If a layer 10 is considered in a "rolled-out" condition, then what it is in the final analysis is a rectangular base area. The rectangular base area, which may include, for example, a copper layer, is then broken down into partial areas (patches) of the same kind that form network elements 13. The patches may be defined as measuring, for example, 2 by 2 mm. As shown via enlarged region 14, for defining the network, adjacent network elements 13 are connected via gates 15 that may be specified by scattering parameters.

A similar network representation is employed in the present embodiment also for the gradient-coil arrangement 7 and the high-frequency antenna 5, with gates 15, though, being defined as the actual terminals of the corresponding coils.

Act S1 is followed by an optimization method which in this embodiment is divided into two optimization processes 16, 17. The two optimization processes 16, 17 are mutually coupled, see arrow 18, such that parallel optimization occurs with respect to the structural parameters. In this embodiment, in a low-frequency optimizing process 17, a first frequency is considered in cases in which only the networks of the high-frequency shield 6 and the gradient-coil arrangement 7 are considered within the scope of a field simulation in act S2a. The first frequency may be a frequency that is relevant for operating gradient-coil arrangement 7, for example in the 5-KHz range. For a high-frequency optimizing process 16 a field simulation is analogously first performed in act S2b at the magnetic resonance frequency of magnetic resonance device 2 as the second frequency. Only the high-frequency antenna 5 and the high-frequency shield 6 are therein considered.

Optimizing criteria are evaluated in acts S3a and S3b after the field simulation, after which either the structural parameters may be varied and a new simulation performed or the optimum is already determined, as is basically known in the case of optimization methods. Since optimization processes 16, 17 are performed in essentially the same way, the specific explanation is limited to optimizing process 16, with the understanding that optimization process 17 is analogous in its performance.

As an algorithm for the field simulation, in this embodiment an algorithm is used that is based on the FIT (Finite Integration Technique) and which as output values, alongside the field distributions and current-density distributions for uniform excitations at gates 15, also supplies the scattering-parameter matrix of the overall system (S). The scattering-parameter matrix is used for evaluating the respective target function, as is shown below using optimization process 16 as an example.

As described herein as an example, what then applies, with B describing the exiting waves and A the entering waves, is $$B = S \cdot A;$$

more precisely, divided into the high-frequency excitation and shield excitation $$\begin{bmatrix} B_{HF} \\ B_{Schirm} \end{bmatrix} = \begin{bmatrix} s_{11} & s_{12} \\ s_{21} & s_{22} \end{bmatrix} \cdot \begin{bmatrix} A_{HF} \\ A_{Schirm} \end{bmatrix}.$$

where $s_{ij}$ are matrices whose variable depends on the number N of gates in the high-frequency shield structure and the number X of gates in the high-frequency antenna structure. Matrix S has $(N+X)*(N+X)$ elements, matrix $s_{11}$ $X*X$, and matrix $s_{22}$ $N*N$.

$A_{Schirm}$ and $B_{Schirm}$ are furthermore linked via a diagonal matrix $S_{Schirm}$ to $N*N$ elements, with the elements of diagonal matrix $S_{Schirm}$, referred to below as $s_{i,j}$, having the following meaning: If adjacent network elements 13 are not connected by a gate 15 (idling), then what applies is $s_{i,j}=1$, if adjacent network elements 13 are directly connected (short circuit), then what applies is $s_{i,j}=-1$, and if adjacent network elements 13 are connected via an impedance, for example a capacitor, then what applies is $$s_{i,j} = \frac{1 + i\omega C Z_L}{1 - i\omega C Z_L}.$$

With the following relationship being used $$A_{Schirm} = S_{Schirm} \cdot A_{Schirm},$$

the result is the already described simplification of formula (1) to:

$$B_{HF} = (s_{11} + (S_{Schirm} - s_{22})^{-1} \cdot s_{21} \cdot s_{12}) \cdot A_{HF}.$$

The absorbed power is to be used as a target function:

$$P_{abs} = |A_{HF}|^2 - |B_{HF}|^2.$$

It is to be minimized by suitably selecting the structural parameters in diagonal matrix $S_{Schirm}$.

Summarizing, the scattering parameters of matrix $S_{Schirm}$ form the structural parameters. The structural parameters may be further supplemented by at least one property of dielectric 11. The entire loss factor $P_{abs}$ is evaluated and minimized the target function.

Analogous operations are also carried out with respect to optimization process 17 at the first frequency. Parallel optimizing processes of such kind and algorithms for coupled optimizing may also be employed in the disclosed methods.

A multiplicity of boundary conditions, as basically known for optimization methods, may also be taken into account in the disclosed methods. Further possibilities are available, for example also for allowing design criteria of high-frequency shield 6 to be matched. Thus it is possible to define a boundary condition that as discrete values for the scattering parameters allows only two values, namely one indicating a connection (short circuit) and one showing no connection (idling). The result may then be a high-frequency shield having a structure with slits, without the need for coupling elements such as coils or capacitors. Other boundary conditions may also be taken into account, for example a defined flux density of the circular portion of the high-frequency field in the isocenter of magnetic resonance device 2, in an excitation layer, and/or in an entire excitation volume if importance is attached to selective excitation possibilities, for example the excitation of just one specific layer. Maximum local loss factor densities and maximum temperature loads—derived therefrom—of high-frequency shield 6 may also be taken into account in a boundary condition. It should finally be pointed out with reference to the boundary conditions that it is also conceivable, for example, to omit optimizing process 17 and to formulate the properties of the shield structure at the low first frequency, for example permeability for gradient fields and temperature load due to eddy-current losses, as a further boundary condition in high-frequency optimizing process 16.

In act S4 there may then finally be at least one optimal structural parameter set, while there also may be from both optimization processes 16, 17 a curve describing optimal structural parameter sets. Further variables describing the quality of high-frequency shield 6 may also be provided in act S4 jointly with the optimal structural parameter set.

When a high-frequency shield 6 having slits is to be created, the ideal structural parameter set may in an optional act S5 be converted into suitable operating parameters for a device for producing high-frequency shield 6. The disclosed methods may therefore in that case be part of the process for producing a high-frequency shield.

Be it noted in conclusion that alongside the possibility described here of considering scattering-parameter matrices, optimization may, as presented in the general part of the description, be performed also on the basis of field distributions and/or current-density distributions. That may then entail overlaying field distributions determined at the respective frequencies or, preferably, current-density distributions for uniform excitations (base excitations) using the structural parameters and checking the structural parameters for typical excitation patterns. The field simulation may in that case have to be performed just once.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for determining and producing an optimal structure of a high-frequency shield of a high-frequency antenna of a magnetic resonance device, the high-frequency shield shielding the high-frequency antenna from a gradient-coil arrangement, the method comprising:

defining a three-dimensional initial structure of the high-frequency shield in accordance with structural parameters and jointly with the high-frequency antenna, the gradient-coil arrangement, or both the high-frequency antenna and the gradient-coil arrangement, wherein one or more of the high-frequency shield, the high-frequency antenna, or the gradient-coil arrangement are specified as a network of identical network elements, with adjacent ones of the network elements being coupled by a gate, the network being specified by scattering parameters;

optimizing the structural parameters via an optimization method in accordance with at least one optimization criterion;

performing a three-dimensional field simulation in accordance with the optimization method for at least one frequency based on the three-dimensional initial structure, the simulation supplying first variables that specify characteristics of the three-dimensional initial structure at the at least one frequency and with respect to the optimization criterion being evaluated;

supplying a scattering-parameter matrix relating to each gate as second variables, the scattering parameters specifying the network of the high-frequency shield as the structural parameters; and producing the high-frequency shield comprising the structural parameters.

2. The method as claimed in claim 1, wherein the optimization criterion includes minimizing overall absorbed power.

3. The method as claimed in claim 1, further comprising supplying one or both of a field distribution for a uniform excitation at each gate and a current-density distribution as third variables, the structural parameters specifying a superimposition of one or both of the field distribution and the current-density distribution.

4. The method as claimed in claim 3, wherein the optimization criterion includes minimizing a sum of high-frequency surface losses, minimizing high-frequency losses in a dielectric, minimizing a sum of the high-frequency surface losses and the high-frequency losses in the dielectric, or minimizing shield attenuation.

5. The method as claimed in claim 1, further comprising conducting field simulations for a first frequency for operating the gradient-coil arrangement and a second frequency for operating the high-frequency antenna, wherein the at least one optimization criterion includes respective optimization criteria for each of the first and second frequencies, and wherein the structural parameters are optimized in parallel for both of the respective optimization criteria.

6. The method as claimed in claim 5, wherein only the gradient-coil arrangement and the high-frequency shield are considered when the field simulation of the first frequency is being performed and only the high-frequency antenna and the high-frequency shield are considered when the field simulation of the second frequency is being performed.

7. The method as claimed in claim 1, wherein properties of the high-frequency shield with respect to eddy currents caused by fields of the gradient-coil arrangement are considered as at least one boundary condition.

8. The method as claimed in claim 7, wherein the three-dimensional field simulation is implemented using a finite difference time domain method or a finite elements method.

9. The method as claimed in claim 7, wherein the high-frequency shield comprises at least two layers.

10. The method as claimed in claim 1, wherein the three-dimensional field simulation is implemented using a finite difference time domain method or a finite elements method.

11. The method as claimed in claim 1, wherein the high-frequency shield comprises at least two layers.

12. The method as claimed in claim 11, further comprising optimizing a further parameter indicative of at least one property of a dielectric disposed between the two layers.

13. The method as claimed in claim 12, wherein boundary conditions of the optimization method include:

a defined flux density of a circular portion of the high-frequency field in an isocenter of the magnetic resonance device, in an excitation layer, or in an excitation volume, a maximum local loss factor density, or the flux density and the maximum local loss factor density; or a maximum temperature load of the high-frequency shield.

14. The method as claimed in claim 1, wherein boundary conditions of the optimization method include:
- a defined flux density of a circular portion of the high-frequency field in an isocenter of the magnetic resonance device, in an excitation layer, or in an excitation volume, a maximum local loss factor density, or the flux density and the maximum local loss factor density; or
- a maximum temperature load of the high-frequency shield.

15. A method for determining and producing an optimal structure of a high-frequency shield of a high-frequency antenna of a magnetic resonance device, the high-frequency shield shielding the high-frequency antenna from a gradient-coil arrangement, the method comprising:
- defining a three-dimensional initial structure of the high-frequency shield in accordance with structural parameters and jointly with the high-frequency antenna, the gradient-coil arrangement, or both the high-frequency antenna and the gradient-coil arrangement, wherein one or more of the high-frequency shield, the high-frequency antenna, or the gradient-coil arrangement are specified as a network of identical network elements, with adjacent ones of the network elements being coupled by a gate, the network being specified by scattering parameters;
- optimizing the structural parameters via an optimization method in accordance with at least one optimization criterion;
- performing a three-dimensional field simulation in accordance with the optimization method for at least one frequency based on the three-dimensional initial structure, the simulation supplying variables that specify characteristics of the three-dimensional initial structure at the at least one frequency and with respect to the optimization criterion being evaluated; and
- producing the high-frequency shield comprising the structural parameters, wherein at least one boundary condition of the optimization method allows the structural parameters to assume as values only a value describing an existing connection between the adjacent network elements and a value describing a non-existent connection between the adjacent network elements.

16. The method as claimed in claim 15, wherein properties of the high-frequency shield with respect to eddy currents caused by fields of the gradient-coil arrangement are considered as the at least one boundary condition.

17. The method as claimed in claim 15, further comprising conducting field simulations for a first frequency for operating the gradient-coil arrangement and a second frequency for operating the high-frequency antenna, wherein the at least one optimization criterion includes respective optimization criteria for each of the first and second frequencies, and wherein the structural parameters are optimized in parallel for both of the respective optimization criteria.

* * * * *